(12) United States Patent
Markle et al.

(10) Patent No.: US 7,262,864 B1
(45) Date of Patent: Aug. 28, 2007

(54) METHOD AND APPARATUS FOR DETERMINING GRID DIMENSIONS USING SCATTEROMETRY

(75) Inventors: Richard J. Markle, Austin, TX (US); Kevin R. Lensing, Austin, TX (US); J. Broc Stirton, Austin, TX (US); Marilyn I. Wright, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 466 days.

(21) Appl. No.: 09/897,573

(22) Filed: Jul. 2, 2001

(51) Int. Cl.
*G01B 11/14* (2006.01)
*G01N 21/86* (2006.01)
*G01V 8/00* (2006.01)
*H01L 21/00* (2006.01)
*H01L 21/66* (2006.01)
*G01R 31/26* (2006.01)

(52) U.S. Cl. ............... 356/625; 250/559.19; 438/7; 438/16

(58) Field of Classification Search ......... 356/625, 356/626, 635, 634, 237.1–237.2, 239.1, 239.3, 356/636; 430/5, 22, 30
See application file for complete search history.

(56) References Cited

U.S. PATENT DOCUMENTS

| 3,620,795 | A | * | 11/1971 | Kiba | ............. | 427/532 |
|---|---|---|---|---|---|---|
| 4,360,269 | A | * | 11/1982 | Iwamoto et al. | ............. | 356/426 |
| 4,547,895 | A | * | 10/1985 | Mita et al. | ............. | 382/144 |
| 4,712,881 | A | * | 12/1987 | Shurtz et al. | ............. | 359/352 |
| 4,790,023 | A | * | 12/1988 | Matsui et al. | ............. | 382/149 |
| 5,294,975 | A | * | 3/1994 | Norman et al. | ............. | 356/401 |

(Continued)

FOREIGN PATENT DOCUMENTS

JP          61207583  A  *  9/1986    ............. 216/60

OTHER PUBLICATIONS

Bishop et al., "Use of Scatterometry for resist process control," *SPIE Integrated Circuit Metrology, Inspection and Process Control*, 1673:441-452, 1992.

(Continued)

*Primary Examiner*—Gregory J. Toatley, Jr.
*Assistant Examiner*—Gordon J. Stock, Jr.
(74) *Attorney, Agent, or Firm*—Williams, Morgan & Amerson, P.C.

(57) ABSTRACT

A test structure includes a first plurality of lines and a second plurality of lines intersecting the first plurality of lines. The first and second pluralities of lines defining a grid having openings. A method for determining grid dimensions includes providing a wafer having a test structure comprising a plurality of intersecting lines that define a grid having openings; illuminating at least a portion of the grid with a light source; measuring light reflected from the illuminated portion of the grid to generate a reflection profile; and determining a dimension of the grid based on the reflection profile. A metrology tool is adapted to receive a wafer having a test structure comprising a plurality of intersecting lines that define a grid having openings. The metrology tool includes a light source, a detector, and a data processing unit. The light source is adapted to illuminate at least a portion of the grid. The detector is adapted to measure light reflected from the illuminated portion of the grid to generate a reflection profile. The data processing unit is adapted to determine a dimension of the grid based on the reflection profile.

47 Claims, 5 Drawing Sheets

U.S. PATENT DOCUMENTS

| | | | | |
|---|---|---|---|---|
| 5,393,624 | A | | 2/1995 | Ushijima .................... 430/30 |
| 5,459,794 | A | * | 10/1995 | Ninomiya et al. .......... 356/400 |
| 5,608,816 | A | * | 3/1997 | Kawahara et al. .......... 382/150 |
| 5,867,276 | A | * | 2/1999 | McNeil et al. .............. 356/445 |
| 5,880,838 | A | * | 3/1999 | Marx et al. ................. 356/351 |
| 5,963,329 | A | * | 10/1999 | Conrad et al. ............. 356/613 |
| 5,985,739 | A | * | 11/1999 | Plettner et al. ............. 438/455 |
| 6,051,348 | A | | 4/2000 | Marinaro et al. ............ 430/30 |
| 6,100,985 | A | * | 8/2000 | Scheiner et al. ............ 356/630 |
| 6,178,256 | B1 | * | 1/2001 | Nguyen et al. ............. 382/144 |
| 6,187,488 | B1 | * | 2/2001 | Hayasaki et al. ............ 430/30 |
| 6,245,584 | B1 | * | 6/2001 | Marinaro et al. ............ 438/14 |
| 6,433,878 | B1 | * | 8/2002 | Niu et al. .................... 356/603 |
| 6,476,920 | B1 | * | 11/2002 | Scheiner et al. ............ 356/630 |
| 6,515,751 | B1 | * | 2/2003 | Craighead et al. .......... 356/519 |
| 6,594,598 | B1 | * | 7/2003 | Ishizuka et al. ............. 702/84 |
| 6,614,540 | B1 | * | 9/2003 | Stirton ....................... 356/630 |
| 2002/0135781 | A1 | * | 9/2002 | Singh et al. ................ 356/601 |

OTHER PUBLICATIONS

Hickman et al., "Use of diffracted light from latent images to improve lithography control," *SPIE Integrated Circuit Metrology, Inspection and Process Control*, 1464:245-257, 1991.

McNeil et al., "Scatterometry applied to microelectronics processing—Part 1," *Solid State Technology*, 37(3):29-56, 1993.

Miller and Mellicamp, "Development of an end-point detection procedure for the post-exposure bake process," *Integrated circuit metrology, inspection, and process control IX:* Feb. 20-22, 1995, Santa Clara, California, *SPIE Integrated Circuit Metrology, Inspection and Process Control*, 2439:78-88, 1995.

Milner et al., "Latent image exposure monitor using scatterometry," *SPIE Integrated Circuit Metrology, Inspection and Process Control*, 1673:274-283, 1992.

Prins et al., "Scatterometric sensor for PEB process control," *Metrology, inspection, and process control for microlithogtaphy, X:* Mar. 11-13, 1996, Santa Clara, California, *SPIE Integrated Circuit Metrology, Inspection and Process Control*, 2725:710-719, 1996.

Raymond et al., "Multiparameter process metrology using scatterometry," In: *Optical characterization techniques for high-performance microelectronic device manufacturing II, SPIE—The International Society for Optical Engineering*, 2638:84-93, Austin, Texas, Oct. 25-26, 1995.

Raymond et al., "Scatterometric sensor for lithography," In: *Manufacturing process control for microelectronic devices and circuits, SPIE—The International Society for Optical Engineering*, 2336:37-49, Austin, Texas, Oct. 20-21, 1994.

Sturtevant et al., "Post-exposure bake as a process-control parameter for chemically-amplified photoresist," *Metrology, inspection, and process control for microlithogtaphy, VII:* Mar. 2-4, 1993, Santa Jose, California, *SPIE Integrated Circuit Metrology, Inspection and Process Control*, vol. 1926, 1993.

Sturtevant et al., "Use of scatterometric latent image detector in closed loop feedback control of linewidth," *SPIE Integrated Circuit Metrology, Inspection and Process Control*, 2196:352-359, 1994.

* cited by examiner

METHOD AND APPARATUS FOR DETERMINING GRID DIMENSIONS USING SCATTEROMETRY

BACKGROUND OF THE INVENTION

1. Field of the Invention

This invention relates generally to the field of semiconductor device manufacturing and, more particularly, to a method and apparatus for determining grid dimensions using scatterometry.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender nonoptimal control of critical processing parameters, such as throughput, accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

Semiconductor devices are manufactured from wafers of a substrate material. Layers of materials are added, removed, and/or treated during fabrication to create the electrical circuits that make up the device. The fabrication essentially comprises four basic operations. Although there are only four basic operations, they can be combined in hundreds of different ways, depending upon the particular fabrication process.

The four operations typically used in the manufacture of semiconductor devices are:

layering, or adding thin layers of various materials to a wafer from which a semiconductor device is produced;

patterning, or removing selected portions of added layers;

doping, or placing specific amounts of dopants in the wafer surface through openings in the added layers; and heat treatment, or heating and cooling the materials to produce desired effects in the processed wafer.

Among the important aspects in semiconductor device manufacturing are rapid thermal annealing (RTA) control, chemical-mechanical polishing (CMP) control, etch control, and photolithography control. As technology advances facilitate smaller critical dimensions for semiconductor devices, the need for reduction of errors increases dramatically. Proper formation of sub-sections within a semiconductor device is an important factor in ensuring proper performance of the manufactured semiconductor device. Critical dimensions of the sub-sections generally have to be within a predetermined acceptable margin of error for semiconductor devices to be within acceptable manufacturing quality.

Generally, most features on a semiconductor device are formed by depositing layers of material (e.g., conductive or insulative) and patterning the process layers using photolithography and etch processes. The various process layers used for forming the features have many specialized functions. Certain layers are used to form conductive features, others are used to form insulating features, and still others are intermediate layers used to enhance the functionality of the processing steps used to pattern and form the functional layers.

There are many variables that affect the accuracy and repeatability of the photolithography and etch processes used to form features from the process layers. Typical metrology data collection for measuring the efficacy of the photolithography and etch processes do not provide data that is sufficiently accurate and timely to facilitate run-to-run control of such processes. Certain techniques, such as scanning electron microscope (SEM) analysis, may be used to generate two-dimensional data, such as a critical width dimension, but they cannot be used to characterize the entire feature. For example, to generate a sidewall angle measurement, an important measure of quality, a destructive cross-section SEM analysis is required. Destructive tests are expensive, as they require destruction of the wafer, and thus, it is impractical to perform such tests at a frequency that would allow run-to-run control.

The present invention is directed to overcoming, or at least reducing the effects of, one or more of the problems set forth above.

SUMMARY OF THE INVENTION

One aspect of the present invention is seen in a test structure including a first plurality of lines and a second plurality of lines intersecting the first plurality of lines. The first and second pluralities of lines defining a grid having openings.

Another aspect of the present invention is seen in a method for determining grid dimensions. The method includes providing a wafer having a test structure comprising a plurality of intersecting lines that define a grid having openings; illuminating at least a portion of the grid with a light source; measuring light reflected from the illuminated portion of the grid to generate a reflection profile; and determining a dimension of the grid based on the reflection profile.

Yet another aspect of the invention is seen in a metrology tool. The metrology tool is adapted to receive a wafer having a test structure comprising a plurality of intersecting lines that define a grid having openings. The metrology tool includes a light source, a detector, and a data processing unit. The light source is adapted to illuminate at least a portion of the grid. The detector is adapted to measure light reflected from the illuminated portion of the grid to generate a reflection profile. The data processing unit is adapted to determine a dimension of the grid based on the reflection profile.

BRIEF DESCRIPTION OF THE DRAWINGS

The invention may be understood by reference to the following description taken in conjunction with the accompanying drawings, in which like reference numerals identify like elements, and in which.

Figure 1:
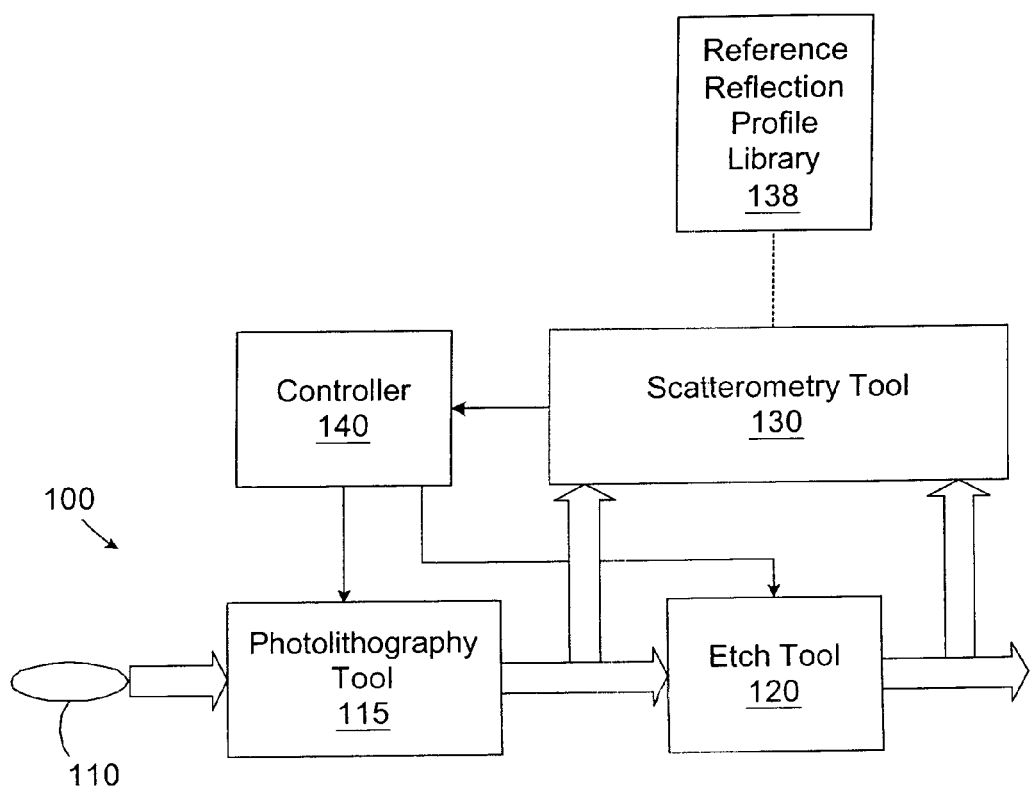
FIG. 1 is a simplified diagram of an illustrative processing line for processing wafers in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring to FIG. 1, a simplified diagram of an illustrative processing line 100 for processing wafers 110 in accordance with one illustrative embodiment of the present invention is provided. The processing line 100 includes a photolithography tool 115 for forming a pattern in a photoresist layer formed on the wafer 110 and an etch tool 120 for etching features of various process layers formed on the wafer 110 using the pattern defined by the photolithography tool 115. The processing line 100 includes a scatterometry tool 130 adapted to measure dimensions of the features formed in either the photoresist layer or the etched process layer using a test structure 200 (shown in FIG. 2) formed on the wafer 110.

In general, the scatterometry tool 130 includes optical hardware, such as an ellipsometer or reflectometer, and a data processing unit loaded with a scatterometry software application for processing data collected by the optical hardware. For example, the optical hardware may include a model OP5140 or OP5240 with a spectroscopic ellipsometer offered by Therma-Wave, Inc. of Freemont Calif. The data processing unit may comprise a profile application server manufactured by Timbre Technologies, a subsidiary of Tokyo Electron Limited, Inc. of Tokyo, Japan and distributed by Therma-Wave, Inc. The scatterometry tool 130 may be external or, alternatively, the scatterometry tool 130 may be installed in an in-situ arrangement.

A controller 140 is provided for providing feedback to the photolithography tool 115 and/or the etch tool 120 based on the measurements generated by the scatterometry tool 130. The controller 140 adjusts the operating recipe of the controlled tool 115, 120 to improve the photolithography or etching process for subsequently processed wafers 110. The controller 140 may also use the measurements generated by the scatterometry tool 130 for fault detection. If the scatterometry tool 130 measures variation sufficient to significantly degrade the performance of the devices, the wafer may be scrapped or reworked prior to performing any additional process steps.

In the illustrated embodiment, the controller 140 is a computer programmed with software to implement the functions described. However as will be appreciated by those of ordinary skill in the art, a hardware controller designed to implement the particular functions may also be used. Moreover, the functions performed by the controller 140, as described herein, may be performed by multiple controller devices distributed throughout a system. Additionally, the controller 140 may be a stand-alone controller, it may be integrated into a tool, such as the photolithography tool 115, etch tool 120, or the scatterometry tool 130, or it may be part of a system controlling operations in an integrated circuit manufacturing facility.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 140, as described, is the Catalyst system offered by KLA-Tencor, Inc. The Catalyst system uses Semiconductor Equipment and Materials International (SEMI) Computer Integrated Manufacturing (CIM) Framework compliant system technologies and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Figure 2:
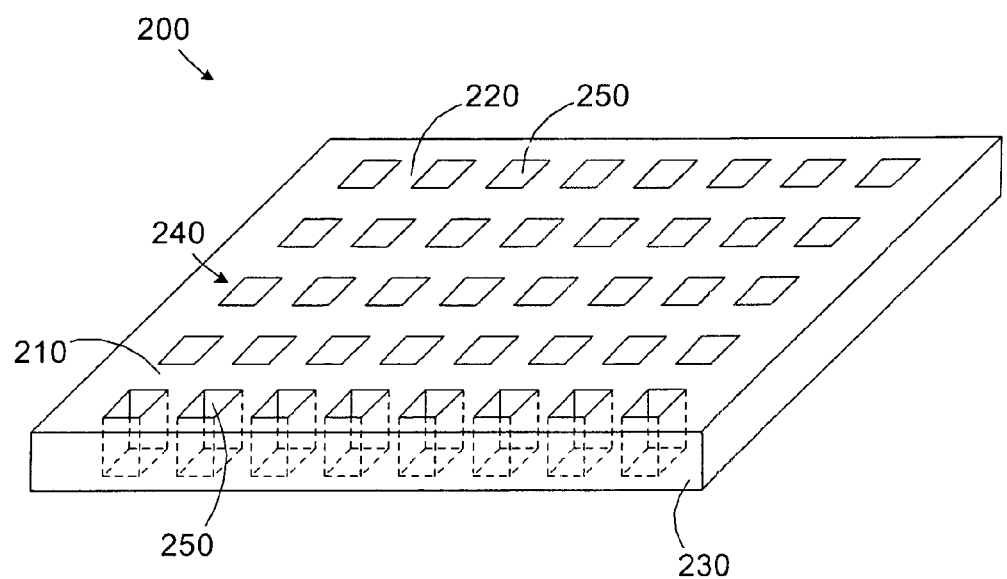
FIG. 2 is a cross section view of an exemplary test structure that may be used in the processing line of FIG. 1.

The test structure 200 of FIG. 2 provides a repeating grating pattern suitable for measuring using scatterometry. The test structure 200 may be formed in a region of the wafer 110 not normally used for forming devices (e.g., in the periphery region where identification codes are typically scribed or in the scribe lines between production die).

As shown in FIG. 2, the test structure 200 includes a plurality of intersecting horizontal lines 210 and vertical lines 220 defined in a base layer 230. The lines 210, 220 define a grid 240 with openings 250. The lines 210, 220 are formed in the base layer 230 in a repeating pattern. The lines 210, 220 may be formed during the same process (i.e., photolithography or etch) that is used to form features in the production devices on the wafer 110. The particular material used to form the base layer 230 may vary depending on the particular process being monitored. For example, the base layer 230 may be a photoresist layer used as a mask pattern for etching, a conductive layer, such as polysilicon or aluminum, an insulative layer, such as silicon dioxide, or a substrate layer, such as epitaxial silicon.

Figure 3:
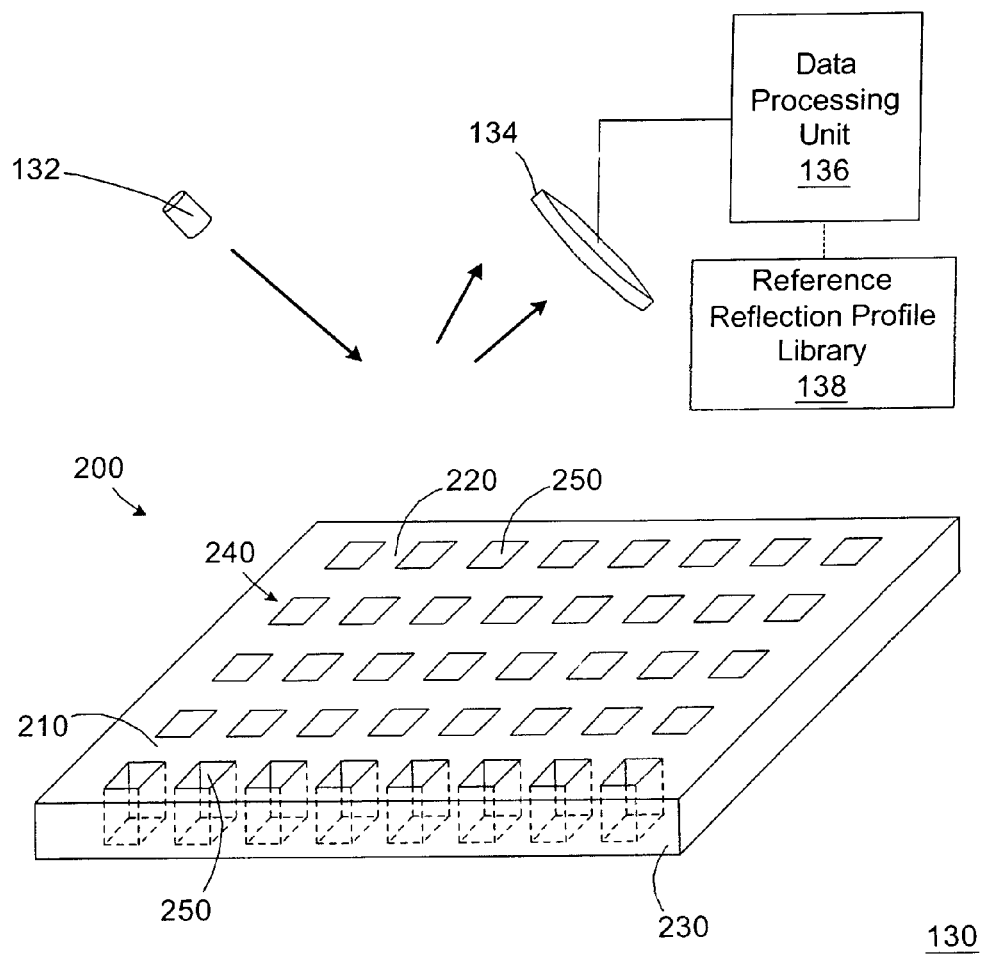
FIG. 3 is a simplified view of the scatterometry tool of FIG. 1.

Turning now to FIG. 3, a simplified view of the scatterometry tool 130 loaded with a wafer 110 having the test structure 200 of FIG. 2 is provided. The scatterometry tool 130, includes a light source 132 and a detector 134 positioned proximate the test structure 200. The light source 132 of the scatterometry tool 130 illuminates at least a portion of the grid 240, and the detector 134 takes optical measurements, such as intensity or phase, of the reflected light. A data processing unit 136 receives the optical measurements from the detector 134 and processes the data to identify dimensions of the grid 240.

The scatterometry tool 130 may use monochromatic light, white light, or some other wavelength or combinations of wavelengths, depending on the specific implementation. The angle of incidence of the light may also vary, depending on the specific implementation. The light analyzed by the scatterometry tool 130 typically includes a reflected component (i.e., incident angle equals reflected angle) and a refracted component (i.e., incident angle does not equal the reflected angle). For purposes of discussion here, the term "reflected" light is meant to encompass both components.

Dimensional variations, such as width, depth, and sidewall angle in the grid 240 cause changes in the reflection profile (e.g., intensity vs. wavelength–$\tan(\delta)$, phase vs. wavelength–$\cos(\psi)$, where $\delta$ and $\psi$ are common scatterometry outputs known to those of ordinary skill in the art) measured by the scatterometry tool 130 as compared to the light scattering profile that would be present in grids 240 having dimensions corresponding to design values, or at least acceptable values.

Figure 4A:
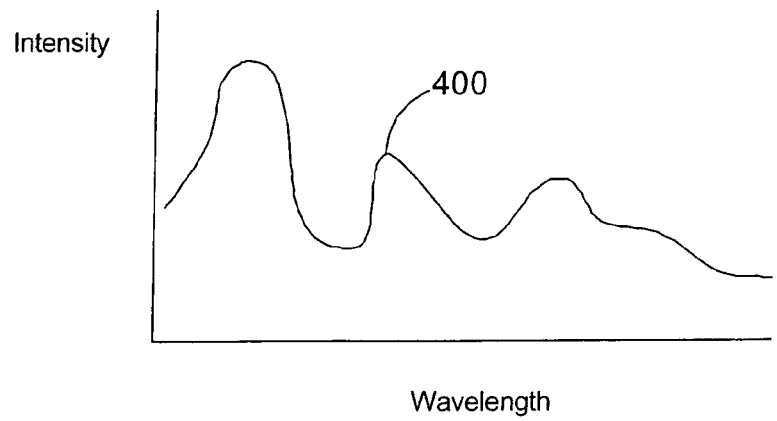
FIGS. 4A, 4B, and 4C illustrate a library of exemplary scatterometry curves used to characterize the wafer measured in the scatterometry tool of FIG. 3.
Figure 4B:
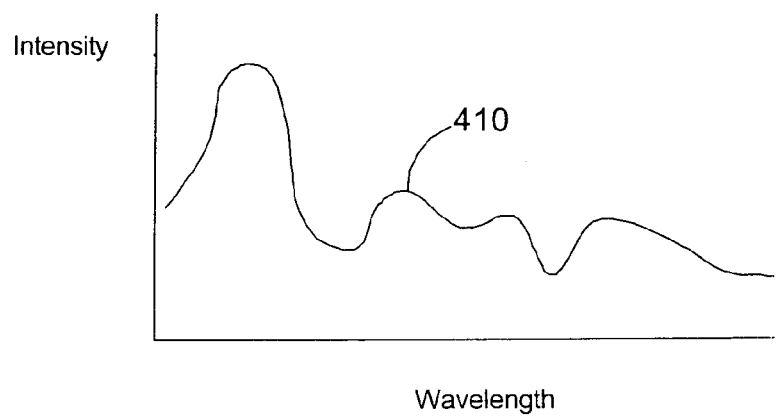
Figure 4C:
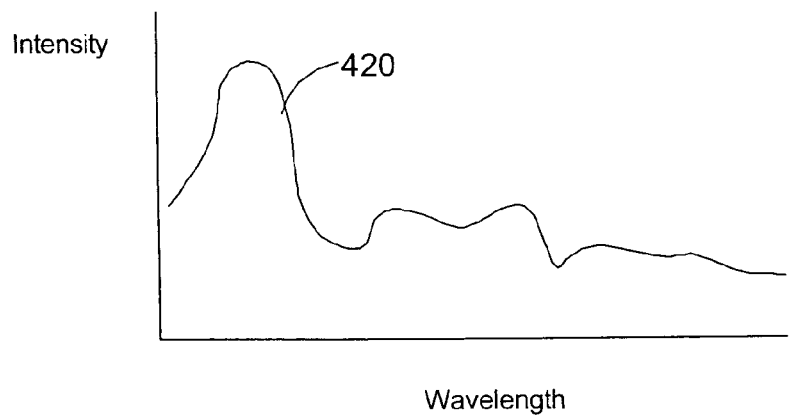

FIGS. 4A, 4B, and 4C illustrate exemplary reflection profiles 400, 410, 420 that may be included in a reference reflection profile library 138 (see FIG. 1) used by the data processing unit 136 to characterize the grid dimensions based on the reflection profiles measured by the scatterometry tool 130. The particular reflection profile expected for any structure depends on the specific geometry of the test structure 200 and the parameters of the measurement technique employed by the scatterometry tool 130 (e.g., light bandwidth, angle of incidence, etc.). The profiles in the reference reflection profile library 138 are typically calculated theoretically by employing Maxwell's equations to model individual spectra based on the expected characteristics of the test structure 200. Spectra are generated at a predetermined resolution for many, if not all, profiles that may be expected, and the sum of all said spectra constitute the reference reflection profile library 138. Scatterometry libraries are commercially available from Timbre Technologies, Inc. The profiles in the reference reflection profile library 138 may also be generated empirically by measuring reflection profiles of sample wafers and subsequently characterizing the measured wafers by destructive or non-destructive examination techniques.

The reflection profile 400 of FIG. 4A represents an exemplary profile for a test structure 200 where the grid 240 has dimensions corresponding to design or target values. The reflection profile 410 of FIG. 4B represents an exemplary profile for a test structure 200 where the grid 240 exhibits openings 250 with a width slightly larger than a desired target value. The reflection profile 420 of FIG. 4C represents an exemplary profile for a test structure 200 where the grid 240 exhibits a further increased width. The reflection profiles of test structures 200 having grids 240 with different amounts of variation may be included in the reference reflection profile library 138. Similarly, reflection profiles may be included that correspond to variations in the depth of the grid 240 and the sidewall angle of the lines 210, 220.

The data processing unit 136 receives a reflection profile measured by the detector 134 and compares it to the reference reflection profile library 138. Each reference profile has an associated grid dimension metric related to the dimensions of the grid 240. For example, the grid dimension metric may comprise actual width, depth, and/or sidewall angle measurements. The data processing unit 136 determines the reference reflection profile having the closest match to the measured reflection profile. Techniques for matching the measured reflection profile to the closest reference reflection profile are well known to those of ordinary skill in the art, so they are not described in greater detail herein. For example, a least squares error technique may be employed.

In another embodiment, the controller 140 or other external controller (not shown) may be adapted to compare the measured reflection profile to the reference reflection profile library 138. In such a case, the scatterometry tool 130 would output the matching reference reflection profile, and the controller 140 may link that reference reflection profile to an associated grid dimension metric.

In still another embodiment, the measured reflection profile may be compared to a target reflection profile selected from the reference reflection profile library 138 for a test structure 200 having grid 240 exhibiting known and desired dimensions (e.g., the reflection profile 400 of FIG. 4A). For example, a target reflection profile may be calculated for a test structure 200 having grid 240 with ideal, or at least acceptable, dimensions using Maxwell's equations, and that target reflection profile may be stored in the reference reflection profile library 138. Thereafter, the measured reflection profile of a test structure 200 with grids having unknown dimensions is compared to the target reflection profile. Based upon this comparison, a relatively rough approximation of the dimensions may be determined. That is, by comparing the measured reflection profile to the target reflection profile, the dimensions of the grid 240 may be approximated, such that further matching of the measured reflection profile with additional reference reflection profiles from the reference reflection profile library 138 is unwarranted. Using this technique, an initial determination may be made as to the grid dimensions. Of course, this step may be performed in addition to the matching or correlating of a measured reflection profile to a reference reflection profile from the reference reflection profile library 138 as described above. The grid dimension approximation may also be used to generate a fault detection signal, where a significant deviation in dimensions may correspond to a failure in the etching process suggestive of a later failure or unacceptable performance of the devices in subsequent electrical testing due to the flawed etch process.

After receiving the grid dimension metric from the scatterometry tool 130, the controller 140 may take a variety of autonomous actions. The actions may include fault detection and/or process control functions. In one embodiment of the present invention, the controller 140 is adapted to modify the operating recipe of the photolithography tool 115 or the etch tool 120 based on the grid dimension metric to control operations on subsequently processed wafers. The controller 140 may adjust the recipe for subsequently processed wafers to control the dimensions of the grid 240. Photolithography recipe parameters, such as exposure time, exposure dose, depth of focus, resist spin speed, soft bake temperature, post exposure bake temperature, cool plate temperature, developer temperature, focus tilt, etc., or etch recipe parameters, such as the etch time, plasma chemical compositions, RF power, gas flow, chamber temperature, chamber pressure, end-point signal, etc., may be changed to correct sidewall angle deviations or depth variations, for example.

Information gathered from the grid dimensional analysis may be useful for judging the performance of photolithography or etch processes uses to form other features on the production devices, such as lines, trenches, contact openings, polish dummy tiles, etc. For example, the etch profile may affect the sidewall angle of the grids and the sidewall angle of a trench or line formed in a production device in a similar fashion. The information that may be extrapolated from the grid 240 dimension analysis may also vary depending on the particular geometry of the grid. For example, the size and aspect ratio of the openings 250 may be selected such that the openings 250 are similar to contact openings formed on the device. Similarly, the dimensions of the grid 240 may be selected to provide feedback about photolithography or etch processes used to form lines or trenches on the device. In some embodiments, multiple grids 240 may be defined in the test structure 200, with each grid 240 being defined to provide feedback concerning a different type of feature.

The controller 140 may use a control model of the photolithography tool 115 or the etch tool 120 for determining its operating recipe. For example, the controller 140 may use a control model relating the grid dimension metric to a particular operating recipe parameter in the photolithography tool 115 or the etch tool 120 to control the process to correct for dimension variations. This correction may also result in the correction of the process as it affects the other features formed on the device. The control model may be developed empirically using commonly known linear or non-linear techniques. The control model may be a relatively simple equation based model (e.g., linear, exponential, weighted average, etc.) or a more complex model, such as a neural network model, principal component analysis (PCA) model, or a projection to latent structures (PLS) model. The specific implementation of the model may vary depending on the modeling technique selected.

Grid dimension models may be generated by the controller 140, or alternatively, they may be generated by a different processing resource (not shown) and stored on the controller 140 after being developed. The grid dimension models may be developed using the photolithography tool 115 or the etch tool 120 or using different tools (not shown) having similar operating characteristics. For purposes of illustration, it is assumed that the grid dimension models are generated and updated by the controller 140 or other processing resource based on the actual performance of the photolithography tool 115 or the etch tool 120 as measured by the scatterometry tool 130. The grid dimension models may be trained based on historical data collected from numerous processing runs of the photolithography tool 115 or the etch tool 120.

The controller 140 may also use the grid dimension metric for fault detection. If the amount of grid dimension variation measured is sufficient to indicate a potentially defective device, the wafer may be scrapped or reworked prior to performing any additional process steps.

Figure 5:
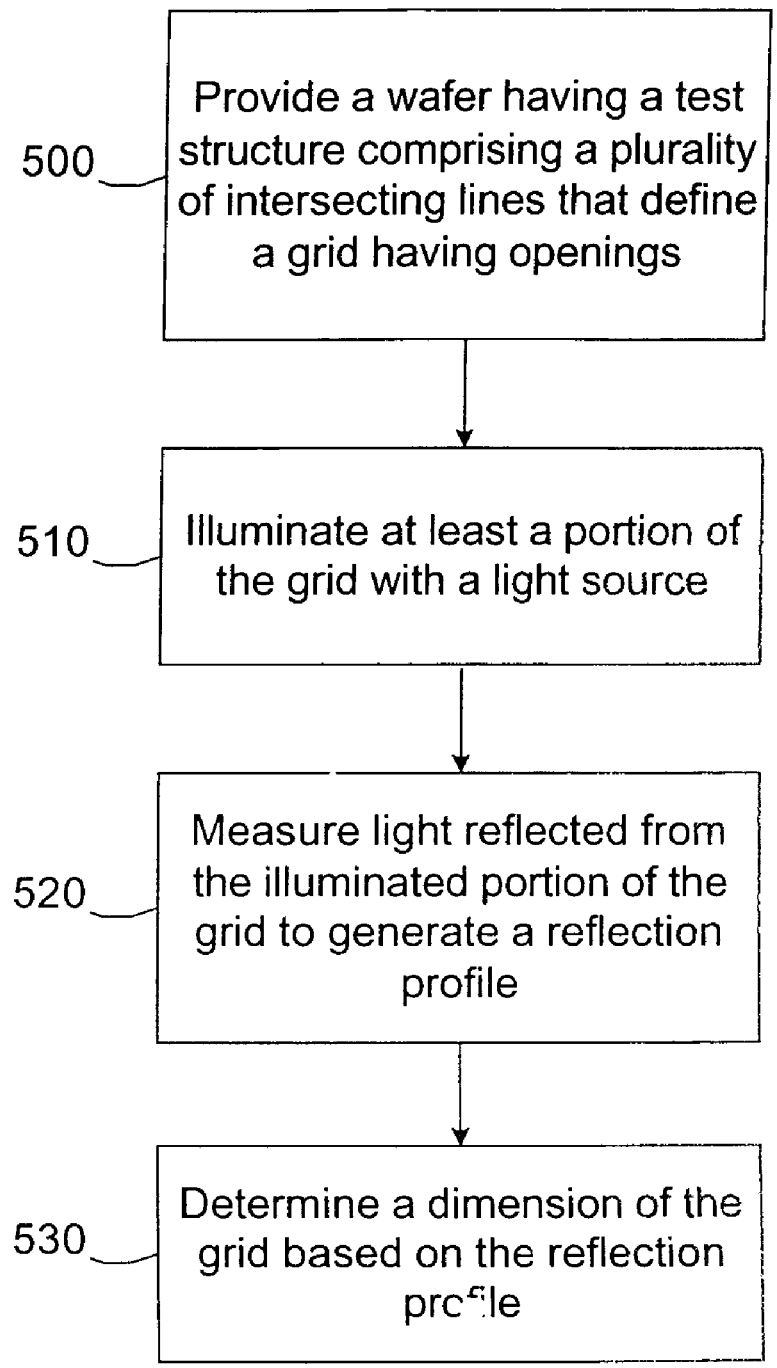
FIG. 5 is a simplified flow diagram of a method for determining grid dimensions using scatterometry measurements in accordance with another illustrative embodiment of the present invention.

FIG. 5 is a simplified flow diagram of a method for determining grid dimensions using scatterometry measurements in accordance with another illustrative embodiment of the present invention. In block 500, a wafer having a test structure 200 comprising a plurality of intersecting lines 210, 220 that define a grid 240 having openings 250 is provided. In block 510, at least a portion of the grid 240 is illuminated with a light source. In block 520, light reflected from the illuminated portion of the grid 240 is measured to generate a reflection profile. In block 530, a dimension (e.g., width, depth, sidewall angle) of the grid 240 is determined based on the reflection profile.

Monitoring grid dimension variations based on measurements from the scatterometry tool 130, as described above, has numerous advantages. The photolithography tool 115 or the etch tool 120 may be controlled to reduce the amount of variation encountered. Decreased variation reduces the likelihood that a device may be degraded or must be scrapped. Accordingly, the quality of the devices produced on the processing line 100 and the efficiency of the processing line 100 are both increased.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method for determining grid dimensions, comprising:
   providing a wafer having a test structure comprising a plurality of intersecting lines that define a grid having openings;
   illuminating at least a portion of the grid with a light source;
   measuring light reflected from the illuminated portion of the grid to generate a reflection profile;
   determining a dimension of the grid based on the reflection profile and providing data relating to determining said dimension of said grid.

2. The method of claim 1, further comprising determining at least one parameter of an operating recipe of a etch tool adapted to etch a subsequent wafer based on the determined grid dimension.

3. The method of claim 1, further comprising determining at least one parameter of an operating recipe of a photolithography tool adapted to process a subsequent wafer based on the determined grid dimension.

4. The method of claim 1, wherein generating the reflection profile comprises generating the reflection profile based on at least one of intensity and phase of the reflected light.

5. The method of claim 1, wherein determining the dimension of the grid further comprises:
comparing the generated reflection profile to a target reflection profile; and
determining the dimension of the grid based on the comparison of the generated reflection profile and the target reflection profile.

6. The method of claim 1, further comprising identifying a fault condition associated with the grid based on the determined grid dimension.

7. The method of claim 1, wherein determining the dimension of the grid further comprises determining at least one of a width dimension, a depth dimension, and a sidewall angle dimension.

8. A method for determining grid dimensions, comprising:
providing a wafer having a test structure comprising a plurality of intersecting lines that define a grid having openings;
illuminating at least a portion of the grid with a light source;
measuring light reflected from the illuminated portion of the grid to generate a reflection profile; and
determining a dimension of the grid based on the reflection profile, wherein determining the dimension of the grid further comprises:
comparing the generated reflection profile to a library of reference reflection profiles, each reference reflection profile having an associated grid dimension metric;
selecting a reference reflection profile closest to the generated reflection profile;
determining the dimension of the grid based on the grid dimension metric associated with the selected reference reflection profile and
providing data relating to determining said dimension of said grid.

9. A method for determining grid dimensions, comprising:
providing a wafer having a test structure comprising a plurality of intersecting lines that define a grid having openings;
illuminating at least a portion of the grid with a light source;
measuring light reflected from the illuminated portion of the grid to generate a reflection profile; and
determining a dimension of the grid based on the reflection profile; and
determining at least one parameter of an operating recipe of a etch tool adapted to etch a subsequent wafer based on the determined grid dimension, wherein determining at least one parameter of the operating recipe of the etch tool comprises determining at least one of an etch time parameter, a plasma chemical composition parameter, an RF power parameter, a gas flow parameter, a chamber temperature parameter, a chamber pressure parameter, and an end-point signal parameter.

10. A method for determining grid dimensions, comprising:
providing a wafer having a test structure comprising a plurality of intersecting lines that define a grid having openings;
illuminating at least a portion of the grid with a light source;
measuring light reflected from the illuminated portion of the grid to generate a reflection profile; and
determining a dimension of the grid based on the reflection profile; and
determining at least one parameter of an operating recipe of a photolithography tool adapted to process a subsequent wafer based on the determined grid dimension, wherein determining at least one parameter of the operating recipe of the photolithography tool comprises determining at least one of an exposure time parameter, an exposure dose parameter, a depth of focus parameter, a resist spin speed parameter, a soft bake temperature parameter, a post exposure bake temperature parameter, a cool plate temperature parameter, a developer temperature parameter, and a focus tilt parameter.

11. A method for determining grid dimensions, comprising:
providing a wafer having a test structure comprising a plurality of intersecting lines that define a grid having openings;
illuminating at least a portion of the grid with a light source;
measuring light reflected from the illuminated portion of the grid to generate a reflection profile;
comparing the generated reflection profile to a library of reference reflection profiles, each reference reflection profile having an associated grid dimension metric;
selecting a reference reflection profile closest to the generated reflection profile;
determining a dimension of the grid based on the grid dimension metric associated with the selected reference reflection profile and
providing data relating to determining said dimension of said grid.

12. The method of claim 11, further comprising determining at least one parameter of an operating recipe of a etch tool adapted to etch a subsequent wafer based on the determined grid dimension.

13. The method of claim 11, further comprising determining at least one parameter of an operating recipe of a photolithography tool adapted to process a subsequent wafer based on the determined grid dimension.

14. The method of claim 11, wherein generating the reflection profile comprises generating the reflection profile based on at least one of intensity and phase of the reflected light.

15. The method of claim 11, further comprising identifying a fault condition associated with the grid based on the determined grid dimension.

16. The method of claim 11, wherein determining the dimension of the grid further comprises determining at least one of a width dimension, a depth dimension, and a sidewall angle dimension.

17. A method for determining grid dimensions, comprising:
providing a wafer having a test structure comprising a plurality of intersecting lines that define a grid having openings;
illuminating at least a portion of the grid with a light source;
measuring light reflected from the illuminated portion of the grid to generate a reflection profile;
comparing the generated reflection profile to a library of reference reflection profiles, each reference reflection profile having an associated grid dimension metric;
selecting a reference reflection profile closest to the generated reflection profile;

determining a dimension of the grid based on the grid dimension metric associated with the selected reference reflection profile; and determining at least one parameter of an operating recipe of a etch tool adapted to etch a subsequent wafer based on the determined grid dimension, wherein determining at least one parameter of the operating recipe of the etch tool comprises determining at least one of an etch time parameter, a plasma chemical composition parameter, an RF power parameter, a gas flow parameter, a chamber temperature parameter, a chamber pressure parameter, and an end-point signal parameter.

18. A method for determining grid dimensions, comprising:

providing a wafer having a test structure comprising a plurality of intersecting lines that define a grid having openings;

illuminating at least a portion of the grid with a light source;

measuring light reflected from the illuminated portion of the grid to generate a reflection profile;

comparing the generated reflection profile to a library of reference reflection profiles, each reference reflection profile having an associated grid dimension metric;

selecting a reference reflection profile closest to the generated reflection profile;

determining a dimension of the grid based on the grid dimension metric associated with the selected reference reflection profile; and determining at least one parameter of an operating recipe of a photolithography tool adapted to process a subsequent wafer based on the determined grid dimension, wherein determining at least one parameter of the operating recipe of the photolithography tool comprises determining at least one of an exposure time parameter, an exposure dose parameter, a depth of focus parameter, a resist spin speed parameter, a soft bake temperature parameter, a post exposure bake temperature parameter, a cool plate temperature parameter, a developer temperature parameter, and a focus tilt parameter.

19. A method for determining grid dimensions, comprising:

providing a wafer having a test structure comprising a plurality of intersecting lines that define a grid having openings;

illuminating at least a portion of the grid with a light source;

measuring light reflected from the illuminated portion of the grid to generate a reflection profile; and comparing the generated reflection profile to a target reflection profile; and determining a dimension of the grid based on the comparison of the generated reflection profile and the target reflection profile and providing data relating to determining said dimension of said grid.

20. The method of claim 19, further comprising determining at least one parameter of an operating recipe of a etch tool adapted to etch a subsequent wafer based on the determined grid dimension.

21. The method of claim 19, further comprising determining at least one parameter of an operating recipe of a photolithography tool adapted to process a subsequent wafer based on the determined grid dimension.

22. The method of claim 19, wherein generating the reflection profile comprises generating the reflection profile based on at least one of intensity and phase of the reflected light.

23. The method of claim 19, further comprising identifying a fault condition associated with the grid based on the determined grid dimension.

24. The method of claim 19, wherein determining the dimension of the grid further comprises determining at least one of a width dimension, a depth dimension, and a sidewall angle dimension.

25. A method for determining grid dimensions, comprising:

providing a wafer having a test structure comprising a plurality of intersecting lines that define a grid having openings;

illuminating at least a portion of the grid with a light source;

measuring light reflected from the illuminated portion of the grid to generate a reflection profile; and comparing the generated reflection profile to a target reflection profile;

determining a dimension of the grid based on the comparison of the generated reflection profile and the target reflection profile; and determining at least one parameter of an operating recipe of a etch tool adapted to etch a subsequent wafer based on the determined grid dimension, wherein determining at least one parameter of the operating recipe of the etch tool comprises determining at least one of an etch time parameter, a plasma chemical composition parameter, an RF power parameter, a gas flow parameter, a chamber temperature parameter, a chamber pressure parameter, and an end-point signal parameter.

26. A method for determining grid dimensions, comprising:

providing a wafer having a test structure comprising a plurality of intersecting lines that define a grid having openings;

illuminating at least a portion of the grid with a light source;

measuring light reflected from the illuminated portion of the grid to generate a reflection profile; and comparing the generated reflection profile to a target reflection profile; and determining a dimension of the grid based on the comparison of the generated reflection profile and the target reflection profile; and determining at least one parameter of an operating recipe of a photolithography tool adapted to process a subsequent wafer based on the determined grid dimension, wherein determining at least one parameter of the operating recipe of the photolithography tool comprises determining at least one of an exposure time parameter, an exposure dose parameter, a depth of focus parameter, a resist spin speed parameter, a soft bake temperature parameter, a post exposure bake temperature parameter, a cool plate temperature parameter, a developer temperature parameter, and a focus tilt parameter.

27. A metrology tool adapted to receive a wafer having a test structure comprising a plurality of intersecting lines that define a grid having openings, comprising:

a light source adapted to illuminate at least a portion of the grid;

a detector adapted to measure light reflected from the illuminated portion of the grid to generate a reflection profile; and a data processing unit adapted to determine a dimension of the grid based on the reflection profile.

28. The metrology tool of claim 27, wherein the data processing unit is further adapted to compare the generated reflection profile to a library of reference reflection profiles, each reference reflection profile having an associated grid dimension metric, select a reference reflection profile closest to the generated reflection profile, and determine the dimension of the grid based on the grid dimension metric associated with the selected reference reflection profile.

29. The metrology tool of claim 27, wherein the detector is further adapted to generate the reflection profile based on at least one of intensity and phase of the reflected light.

30. The metrology tool of claim 27, wherein the metrology tool comprises at least one of a scatterometer, an ellipsometer, and a reflectometer.

31. The metrology tool of claim 27, wherein the data processing unit is further adapted to compare the generated reflection profile to a target reflection profile and determine the dimension of the grid based on the comparison of the generated reflection profile and the target reflection profile.

32. A processing line, comprising:
a processing tool adapted to process wafers in accordance with an operating recipe;
a metrology tool adapted to receive a wafer having a test structure comprising a plurality of intersecting lines that define a grid having openings, the metrology tool comprising:
a light source adapted to illuminate at least a portion of the grid;
a detector adapted to measure light reflected from the illuminated portion of the grid to generate a reflection profile; and
a data processing unit adapted to determine a dimension of the grid based on the reflection profile; and
a controller adapted to determine at least one parameter of the operating recipe of the processing tool based on the determined grid dimension.

33. The processing line of claim 32, wherein the data processing unit is further adapted to compare the generated reflection profile to a library of reference reflection profiles, each reference reflection profile having an associated grid dimension metric, select a reference reflection profile closest to the generated reflection profile, and determine the dimension of the grid based on the grid dimension metric associated with the selected reference reflection profile.

34. The processing line of claim 32, wherein the detector is further adapted to generate the reflection profile based on at least one of intensity and phase of the reflected light.

35. The processing line of claim 32, wherein the metrology tool comprises at least one of a scatterometer, an ellipsometer, and a reflectometer.

36. The processing line of claim 32, wherein the data processing unit is further adapted to compare the generated reflection profile to a target reflection profile and determine the dimension of the grid based on the comparison of the generated reflection profile and the target reflection profile.

37. A processing line, comprising:
a processing tool adapted to process wafers in accordance with an operating recipe;
a metrology tool adapted to receive a wafer having a test structure comprising a plurality of intersecting lines that define a grid having openings, the metrology tool comprising:
a light source adapted to illuminate at least a portion of the grid;
a detector adapted to measure light reflected from the illuminated portion of the grid to generate a reflection profile; and
a data processing unit adapted to determine a dimension of the grid based on the reflection profile; and
a controller adapted to determine at least one parameter of the operating recipe of the processing tool based on the determined grid dimension, wherein the processing tool further comprises an etch tool, and the controller is further adapted to determine at least one of an etch time parameter, a plasma chemical composition parameter, an RF power parameter, a gas flow parameter, a chamber temperature parameter, a chamber pressure parameter, and an end-point signal parameter.

38. A processing line, comprising:
a processing tool adapted to process wafers in accordance with an operating recipe;
a metrology tool adapted to receive a wafer having a test structure comprising a plurality of intersecting lines that define a grid having openings, the metrology tool comprising:
a light source adapted to illuminate at least a portion of the grid;
a detector adapted to measure light reflected from the illuminated portion of the grid to generate a reflection profile; and
a data processing unit adapted to determine a dimension of the grid based on the reflection profile; and
a controller adapted to determine at least one parameter of the operating recipe of the processing tool based on the determined grid dimension, wherein the processing tool further comprises a photolithography tool, and the controller is further adapted to determine at least one of an exposure time parameter, an exposure dose parameter, a depth of focus parameter, a resist spin speed parameter, a soft bake temperature parameter, a post exposure bake temperature parameter, a cool plate temperature parameter, a developer temperature parameter, and a focus tilt parameter.

39. The processing line of claim 32, wherein the controller is further adapted to identify a fault condition associated with the grid based on the determined grid dimension.

40. A metrology tool adapted to receive a wafer having a test structure comprising a plurality of intersecting lines that define a grid having openings, comprising:
a light source adapted to illuminate at least a portion of the grid;
a detector adapted to measure light reflected from the illuminated portion of the grid to generate a reflection profile; and
a data processing unit adapted to compare the generated reflection profile to a library of reference reflection profiles, each reference reflection profile having an associated grid dimension metric, select a reference reflection profile closest to the generated reflection profile, and determine a dimension of the grid based on the grid dimension metric associated with the selected reference reflection profile.

41. A metrology tool adapted to receive a wafer having a test structure comprising a plurality of intersecting lines that define a grid having openings; a plurality of trenches, comprising:
a light source adapted to illuminate at least a portion of the grid;
a detector adapted to measure light reflected from the illuminated portion of the grid to generate a reflection profile; and a data processing unit adapted to compare the generated reflection profile to a target reflection profile and determine a dimension of the grid based on the comparison of the generated reflection profile and the target reflection profile.

42. A test structure, comprising:
a first plurality of lines;
a second plurality of lines intersecting the first plurality of lines, the first and second pluralities of lines defining a grid having openings; and
wherein said grid to provide for reflecting light as a result of illuminating at least a portion of the grid such that a reflection profile may be generated using said reflecting light.

43. The test structure of claim 42, further comprising a process layer, the grid being defined in the process layer.

44. The test structure of claim 42, wherein the process layer comprises at least one of a photoresist layer, a substrate layer, an insulative layer, and a conductive layer.

45. A metrology tool, comprising:
means for receiving a wafer having a test structure comprising a plurality of intersecting lines that define a grid having openings;
means for illuminating at least a portion of the grid with a light source;
means for measuring light reflected from the illuminated portion of the grid to generate a reflection profile; and
means for determining a dimension of the grid based on the reflection profile.

46. The metrology tool of claim 45, further comprising:
means for comparing the generated reflection profile to a library of reference reflection profiles, each reference reflection profile having an associated grid dimension metric;
means for selecting a reference reflection profile closest to the generated reflection profile; and
means for determining the dimension of the grid based on the grid dimension metric associated with the selected reference reflection profile.

47. The metrology tool of claim 45, further comprising:
means for comparing the generated reflection profile to a target reflection profile; and
means for determining the dimension of the grid based on the comparison of the generated reflection profile and the target reflection profile.

* * * * *